(12) United States Patent  
Fuller et al.

(10) Patent No.: US 7,435,671 B2
(45) Date of Patent: Oct. 14, 2008

(54) TRILAYER RESIST SCHEME FOR GATE ETCHING APPLICATIONS

(75) Inventors: Nicholas C. Fuller, Ossining, NY (US); Timothy J. Dalton, Ridgefield, CT (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 105 days.

(21) Appl. No.: 11/506,227

(22) Filed: Aug. 18, 2006

(65) Prior Publication Data

US 2008/0045011 A1    Feb. 21, 2008

(51) Int. Cl.
*H01L 21/3205* (2006.01)
(52) U.S. Cl. .......... 438/591; 438/163; 438/585
(58) Field of Classification Search ........ 438/585, 438/586, 587, 591, 163, 199, 229; 257/327, 257/335, 369, 391
See application file for complete search history.

(56) References Cited

U.S. PATENT DOCUMENTS 6,605,514 B1 * 8/2003 Tabery et al. ............... 438/303
7,301,206 B2 * 11/2007 Yeo et al. ................... 257/369
2006/0094230 A1   5/2006 Fuller et al.
2007/0045230 A1 * 3/2007 Keller et al. ............... 216/81

* cited by examiner

*Primary Examiner*—Kevin M Picardat
(74) *Attorney, Agent, or Firm*—Scully, Scott, Murphy & Presser, P.C.; Robert M. Trepp, Esq.

(57) ABSTRACT

A trilayer resist (TLR) patterning scheme is provided to enable gate conductors, particularly polySi gate conductors, with critical dimensions (CDs) of less than 40 nm and minimal LER and LWR. In accordance with the present invention, the inventive patterning scheme utilizes an organic/inorganic/organic multilayer stack instead of an organic layer used in the prior art. The top organic layer of the inventive TLR is a photoresist material such as a 193 nm photoresist that is located atop an antireflective coating (ARC), which is also comprised of an organic material. The middle inorganic layer of the TLR comprises any oxide layer such as, for example, a low temperature (less than or equal to 250° C.) chemical vapor deposited (CVD) oxide, an oxide derived from TEOS (tetraethylorthosilicate), silicon oxide, a silane oxide, or a Si-containing ARC material. The bottom organic layer of the TLR comprises any organic layer such as, for example, a Near Frictionless Carbon (NFC), a diamond-like carbon, a thermosetting polyarylene ether.

14 Claims, 6 Drawing Sheets

TRILAYER RESIST SCHEME FOR GATE ETCHING APPLICATIONS

FIELD OF THE INVENTION

The present invention generally relates to integrated circuits (ICs), and more particularly, to complementary metal oxide semiconductor (CMOS) devices such as, for example, n-type and/or p-type field effect transistors (FETs), in which an integration scheme is employed for achieving sub ground rule (on the order of less than 40 nm) gate critical dimension (CD) for 45 nm and beyond front-end-of-the-line (FEOL) technologies. The inventive integration scheme also improves gate width modulation and, thus, achieves higher speed devices and ring oscillators.

BACKGROUND OF THE INVENTION

Generally, semiconductor devices include a plurality of circuits which form an integrated circuit (IC) including, for example, chips, thin film packages and printed circuit boards. ICs can be useful for computers and electronic equipment and can contain millions of transistors and other circuit elements that are fabricated on the same semiconductor wafer.

For the device to be functional, the gate conductor of the pFETs and/or nFETs typically has minimal line edge roughness (LER) and line width roughness (LWR) so as to enable faster devices and ring oscillators. The term "ring oscillators" refers to a series of invertors the speed of which ultimately determines the clock speed of the integrated circuitry. In the case of polySi gate conductors, a minimal LER of about 3 nm and a minimal LWR of about 3 nm are obtained for conventional CMOS processing.

For current 65 nm CMOS devices, polySi gates of 100 nm thickness and 40 nm critical dimension (CD) are employed. For future technologies whereby continued device shrinking will be one methodology of achieving higher speed oscillators and circuits, it is essential that processing methodologies are developed to facilitate gates that have a CD of less than 40 nm with minimal LER and LWR.

In the prior art, the gate conductors are patterned utilizing the structure that is illustrated in FIG. 1. In particular, FIG. 1 shows a substrate 10, a gate dielectric 12 and a gate conductor 14. The gate conductor 14 has an ARC (antireflective coating) 16 thereon and a patterned photoresist 18 is located on the ARC 16. Patterning of the gate conductor is achieved by first trimming the ARC 16 and then utilizing an etching process which selectively removes the underlying gate conductor 14. The prior art structure illustrated in FIG. 1 suffers from the above-mentioned problems. In particular, this prior art structure does not adequately provide a means for achieving sub ground rule gate CDs.

SUMMARY OF THE INVENTION

The present invention provides a FEOL CMOS device in which a trilayer "resist" (TLR) patterning scheme comprising organic/inorganic/organic layers is used to produce sub ground rule (less than 40 nm) gate structures of negligible LER and LWR. Negligible LER and LWR imply that the 3σ variation in the gate CD is much, much less than 3 nm. The inventive TLR patterning scheme enables higher speed ICs and ring oscillators. Moreover, the inventive TLR patterning scheme provides FEOL CMOS devices in which there is no notching between pre-doped and undoped gate conductor layers. Furthermore, the inventive TLR patterning scheme provides FEOL CMOS devices in which the gate conductor aspect ratio is about 5:1 (for pre-doped gate conductor, 25 nm CDs) to about 7:1 (undoped gate conductor, 22 nm CDs).

As stated above, the present invention provides a TLR patterning scheme to enable gate conductors, particularly polySi gate conductors, with CDs of less than 40 nm and minimal LER and LWR. In accordance with the present invention, the inventive patterning scheme utilizes an organic/inorganic/organic multilayer stack instead of the single organic layer, e.g., ARC and photoresist, used in the prior art. The top organic layer of the inventive TLR is an organic photoresist material such as a 193 nm photoresist that is located atop an antireflective coating (ARC), which is also comprised of an organic material. The middle inorganic layer of the inventive TLR comprises any oxide layer such as, for example, a low temperature (less than or equal to 250° C.) chemical vapor deposited (CVD) oxide, an oxide derived from TEOS (tetraethylorthosilicate), silicon oxide, or silane oxide. Any Si-containing ARC material can also be used as the middle inorganic layer. The bottom organic layer of the inventive TLR comprises any organic layer such as, for example, a Near Frictionless Carbon (NFC), a diamond-like carbon, or a thermosetting polyarylene ether. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The inventive TLR patterning scheme is capable of providing less than 40 nm gates with ideal profiles owning to an enhanced "resist" budget. In the prior art, the resist thicknesses for 65 nm and beyond technologies are less than or equal to 200 nm, further, given lithographic limitations it is necessary to perform an isotropic etch (i.e., trimming step) of the resist so as to achieve the target CD, both this and the etching of the ARC results in significant resist loss and minimal resist budget for transferring a pattern through a 100 nm polySi gate conductor. The inventive TLR scheme circumvents these issues as the photoresist (i.e., the top organic layer) is only needed for pattern transfer through the inorganic layer. The thickness of the middle inorganic layer can be specifically tailored so as to ensure sufficient resist budget for this first step of the inventive TLR patterning scheme without compromising the lithographic process window.

The remaining top organic layer is subsequently consumed during the etching of the bottom organic layer that is located beneath the middle inorganic layer of the inventive TLR. Since there is significant contrast between the inorganic layer and the bottom organic layer of the TLR, the etch process used to etch the bottom organic layer offers sufficient selectivity for complete pattern transfer through the bottom organic layer. The relatively thin inorganic layer of the inventive TLR is consumed during the native oxide 'breakthrough' etching step rendering the bottom organic layer as a mask for the remainder of the gate etch process.

Since the thickness of the bottom organic layer of the inventive TLR can be arbitrarily chosen to meet resist budget requirements, sufficient budget exists for completing the etch process and minimizing the extend of LER and LWR that typically occurs with diminished resist budgets. Further, since the degree/extent of over etching during the etching of the bottom organic layer determines the final gate CD, this can be tailored to a desired value (less than 40 nm), the minimum value of which is now limited by the aspect ratio of the bottom organic layer and the mechanical integrity of this layer itself.

For pre-doped nFET devices, the pre-doped gate conductor layer isotropically etches in fluorine, chlorine or HBr chemistries. As such, passivation of the sidewall of the pre-doped layer during the gate conductor etch process becomes significant for maintaining an ideal gate profile. This necessary condition sets up a trade-off between the former (passivation of the pre-doped layer) and maintaining the profile of the bottom organic layer. The process window for this tradeoff can be carefully widened by choosing the appropriate thickness of the bottom organic layer such that the aspect ratio of this layer enables a sufficiently wide process window for pre-doped gate conductor passivation and an ideal profile of this masking layer (i.e., avoiding flop over or buckling). In this manner, gate CDs of about 25 nm are feasible at 0.1 $\mu m^2$ ground rules.

In general terms, the present invention provides a gate conductor patterning scheme that comprises:

providing a trilayer resist (TLR) on a surface of a gate conductor, said TLR comprises a top organic layer, a middle inorganic layer and a bottom organic layer;

patterning said top organic layer by lithography and trimming;

first etching said middle inorganic layer utilizing said patterned top organic layer as a first pattern mask, wherein during said etching a portion of said top organic layer is consumed;

second etching said bottom organic layer utilizing said patterned middle inorganic layer as a second pattern mask, wherein during said second etching said top organic layer is completely consumed;

third etching said gate conductor utilizing said etched bottom organic layer as a third pattern mask, wherein during said third etching said middle inorganic layer is removed; and stripping the etched bottom organic layer to provide at least one patterned gate conductor having a critical dimension of less than 40 nm.

In a preferred embodiment of the present invention, the inventive TLR etching scheme comprises:

providing a trilayer resist (TLR) on a surface of a polysilicon gate conductor, said TLR comprises a top photoresist/antireflective coating layer, a middle oxide layer and a bottom organic layer;

patterning said top photoresist/antireflective coating layer by lithography and trimming;

first etching said middle oxide layer utilizing said patterned top photoresist/antireflective coating layer as a first pattern mask, wherein during said etching a portion of said top photoresist/antireflective coating layer is consumed;

second etching said bottom organic layer utilizing said patterned middle oxide layer as a second pattern mask, wherein during said second etching said top photoresist/antireflective coating layer is completely consumed;

third etching said polysilicon gate conductor utilizing said etched bottom organic layer as a third pattern mask, wherein during said third etching said middle oxide layer is removed; and stripping the etched bottom organic layer to provide at least one patterned polysilicon gate conductor having a critical dimension of less than 40 nm.

In addition to the patterning method described above, the present invention also provides a CMOS structure that comprises at least one patterned gate conductor located on a surface of a gate dielectric layer, said at least one patterned gate conductor having a critical dimension of less than 40 nm.

BRIEF DESCRIPTION OF THE DRAWINGS

FIG. 4A is for a variable CD array and FIG. 4B is for a ring oscillator.

DETAILED DESCRIPTION OF THE INVENTION

The present invention, which provides a trilayer resist (TLR) scheme for gate etching applications and CMOS structures formed by utilizing the same, will now be described in greater detail by referring to the following discussion and drawings that accompany the present application. It is noted that the drawings including the cross sectional views are provided for illustrative purposes and, as such, the same are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, an alternative patterning scheme is presented to enable manufacture of sub ground rule (<40 nm) gates with minimal line edge roughness (LER) and line width roughness (LWR). The inventive trilayer "resist" (TLR) patterning scheme offers enhanced resist budget compared with conventional single layer "resist" (SLR) patterning. The alternating stack (organic/inorganic/organic) affords increased resist budget since when any of the neighboring layers that are being etched, the "opposite" layer is serving as the pattern transfer layer, facilitating significant selectivity. The bottom organic layer facilitates enhanced resist budget as the thickness of this layer can be carefully chosen such that a sufficiently wide process window for passivating the pre-doped poly layer and avoiding buckling/flop over of the bottom organic layer is achieved. In this manner, 25 nm gates with minimal LER and LWR are feasible.

Figure 1:
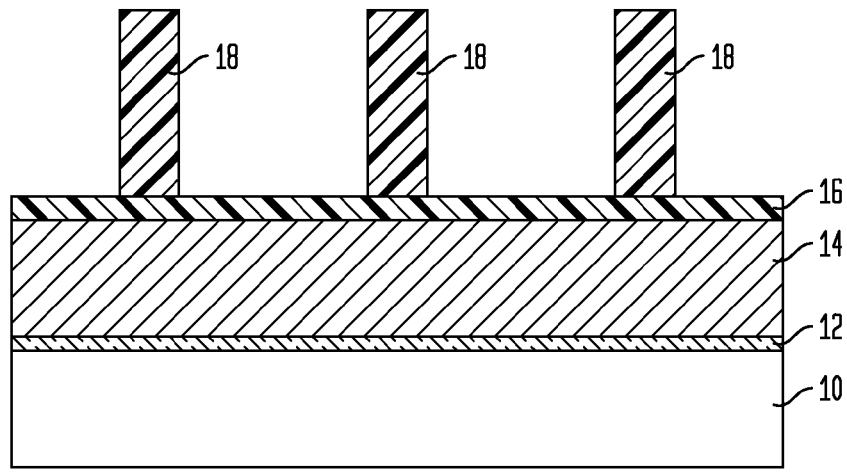
FIG. 1 is a pictorial representation (through a cross sectional view) depicting a prior art structure used for etching a gate conductor.
Figure 2:
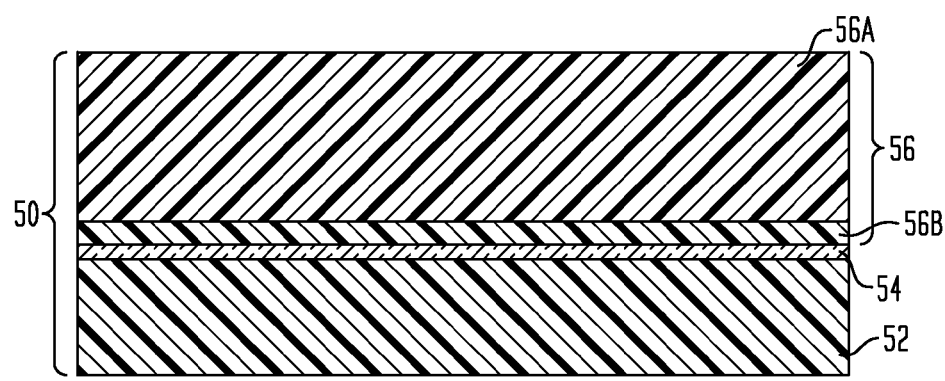
FIG. 2 is a pictorial representation (through a cross sectional view) depicting the inventive TLR prior to processing the same.

Before describing the inventive TLR patterning scheme in greater detail, reference is made to FIG. 2 which illustrates the trilayer resist (TLR) 50 of the present invention. It is noted that the TLR 50 illustrated FIG. 2 is after deposition of the various layers of the multilayer stack, but prior to processing any of the layers within the TLR 50.

Specifically, and as illustrated, the TLR 50 includes an organic/inorganic/organic multilayer stack instead of a single organic layer used in the prior art. The top organic layer (denoted by reference numeral 56) of the inventive TLR 50 comprises any conventional organic photoresist material 56A, such as a 193 nm photoresist, that is located atop an antireflective coating (ARC) 56B. Illustrative examples of 193 nm photoresists include methacrylates. Other types of organic photoresists such as, for example, polyesters can also be employed. The ARC 56B is comprised of well-known organic materials such as, for example, polyarylenes.

The photoresist material and ARC are formed utilizing any conventional deposition process including, for example, chemical vapor deposition (CVD), plasma enhanced chemical vapor deposition (PECVD), evaporation, chemical solution deposition and spin-on coating. Combinations of these various deposition techniques can also be used in forming the top organic layer 56 of the inventive TLR 50.

The thickness of the top organic layer 56 of the inventive TLR 50 may vary depending on the materials of each of the films within layer 56 as well as the exact deposition techniques that were used in forming the same. Typically, the overall thickness of the top organic layer 56 of the inventive TLR 50 after deposition ("as-deposited") is from about 400 to about 1500 Å, with an overall as-deposited thickness of about 600 to about 1200 Å being even more typical.

In accordance with the present invention, the organic photoresist material 56A is thicker than that of the ARC 56B. Typically, the organic photoresist material 56A has a thickness from about 1000 to about 3000 Å, with an overall as-deposited thickness of about 1000 to about 2000 Å being even more typical. In the case of the ARC 56B, that film of the top organic layer 56 of the inventive TLR 50 has a thickness from about 400 to about 1500 Å, with an overall as-deposited thickness of about 600 to about 1200 Å being even more typical.

The middle inorganic layer (denoted by reference numeral 54) of the TLR 50 comprises any oxide film such as, for example, a low temperature (less than or equal to 250° C.) chemical vapor deposited (CVD) oxide, an oxide derived from TEOS (tetraethylorthosilicate), silicon oxide, silane oxides as well as a Si-containing ARC material. Multilayers of these inorganic materials are also contemplated in the present application. In one embodiment of the present invention, oxides are used as the middle inorganic layer 54 of the inventive TLR 50.

The middle inorganic layer 54 of the inventive TLR 50 is formed utilizing any conventional deposition process including, for example, chemical vapor deposition (CVD), plasma enhanced chemical vapor deposition (PECVD), evaporation, chemical solution deposition and spin-on coating.

The thickness of the middle inorganic layer 54 of the inventive TLR 50 may vary depending on the material of the film as well as the exact deposition technique that was used in forming the same. Typically, the overall as-deposited thickness of the middle inorganic layer 54 of the inventive TLR 50 is from about 200 to about 1000 Å, with an overall as-deposited thickness of about 200 to about 800 Å being even more typical.

The bottom organic layer (denoted by reference numeral 52) of the TLR 50 comprises any organic layer such as, for example, a Near Frictionless Carbon (NFC), a diamond-like carbon, a thermosetting polyarylene ether such as, for example, SiLK sold by Dow Chemical Co., or any combination, e.g., multilayers, thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The bottom organic layer 52 of the inventive TLR 50 is formed utilizing any conventional deposition process including, for example, chemical vapor deposition (CVD), plasma enhanced chemical vapor deposition (PECVD), evaporation, chemical solution deposition and spin-on coating.

The thickness of the bottom organic layer 52 of the inventive TLR 50 may vary depending on the material of the film as well as the exact deposition technique that was used in forming the same. Typically, the overall as-deposited thickness of the organic layer 52 of the inventive TLR 50 is from about 200 to about 2000 Å, with an overall as-deposited thickness of about 600 to about 1000 Å being even more typical.

Reference is now made to FIGS. 3A-3G which illustrate the inventive TLR gate patterning scheme. The inventive integration scheme involves first providing the structure 60 shown in FIG. 3A. As is illustrated, the structure 60 comprises a semiconductor substrate 62 that has a material stack comprising at least a gate dielectric 64 and a gate conductor 66. As is shown, the gate conductor 66 typically, but not necessarily always, is located directly atop a surface of the gate dielectric 64.

Figure 3A:
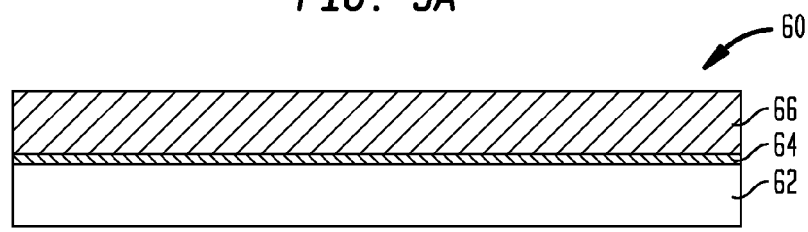
FIGS. 3A-3G are pictorial representations (through cross sectional views) depicting the inventive TRL gate conductor patterning process.

The semiconductor substrate 62 of the structure 60 shown in FIG. 3A comprises any semiconducting material including, for example, Si, SiC, SiGeC, Ge, SiGe, Ga, GaAs, InAs, InP as well as other III/V or II/VI compound semiconductors. Layered semiconductors such as, for example, Si/SiGe and semiconductor-on-insulators (SOIs) as well as bulk semiconductor substrates are also contemplated herein. Typically, the semiconductor substrate 62 is a Si-containing semiconductor such as, for example, Si, SiC, SiGe, SiGeC, or a silicon-on-insulator. The substrate 62 may be unstrained, strained or include regions of strain and unstrain therein. The substrate 62 may be intrinsic or it may be doped with, for example, but not limited to: B, As or P.

When SOI substrates are employed, those substrates include a top semiconductor layer and a bottom semiconductor layer that are separated at least in part by a buried insulating layer. The buried insulating layer includes, for example, a crystalline or non-crystalline oxide, nitride or any combination thereof. Preferably, the buried insulating layer is an oxide. Typically, the buried insulating layer is formed during initial stages of a layer transfer process or during an ion implantation and annealing process, such as, for example, SIMOX (separation by ion implantation of oxygen).

The substrate 12 may have a single crystal orientation or alternatively hybrid semiconductor substrates having surface regions of different crystal orientations can also be employed. The hybrid orientated (HOT) substrate allows for fabricating a FET upon a specific crystal orientation that enhances the performance of each FET formed. For example, the hybrid substrate allows for providing a structure in which a pFET can be formed on a (110) crystal orientation, while the nFET can be formed on a (100) crystal orientation. When a hybrid substrate is used, it may have SOI-like properties, bulk-like properties or a combination of SOI- and bulk-like properties.

In some embodiments of the present invention, at least one isolation region (not shown) is formed into the substrate 62.

The at least one isolation region may include a trench isolation region, a field oxide isolation region or combinations thereof. The isolation regions are formed utilizing processing techniques well known to those skilled in the art.

The gate dielectric 64 comprises any insulating material including, for example, an oxide, nitride, oxynitride, high k material (i.e., a dielectric material having a dielectric constant that is greater than silicon dioxide) or any combination thereof including multilayers. Preferably, the gate dielectric 64 is comprised of an oxide such as, for example, $SiO_2$.

The gate dielectric 64 is formed utilizing a conventional deposition process including, for example, chemical vapor deposition (CVD), plasma enhanced chemical vapor deposition (PECVD), atomic layer deposition (ALD), evaporation and chemical solution deposition. Alternatively, the gate dielectric 64 can be formed by a thermal process such as, for example, oxidation, nitridation and/or oxynitridation. In some embodiments, a combination of the aforementioned techniques can be employed.

The thickness of the gate dielectric 64 may vary depending on the chemical nature of the insulating material, the number of insulating materials present, and the technique that was used to form the same. Typically, the gate dielectric 64 has a thickness from about 0.8 to about 2.0 nm, with a thickness from about 1.0 to about 1.4 nm being even more typical.

The gate conductor 66 is comprised of any conductive material including, for example, polySi, SiGe, a metal, a metal alloy, a metal silicide, a metal nitride or combinations including multilayers thereof. Preferably, the gate conductor 66 is comprised of polySi. The gate conductor 66 can be pre-doped prior to patterning or undoped. If doped, an in-situ doping deposition process may be employed in forming the same. Alternatively, a doped gate conductor can be formed by deposition, ion implantation and annealing. The ion implantation and annealing can occur prior to or after a subsequent etching step that patterns the material stack.

The gate conductor 66 can be formed by any conventional deposition process including CVD, PECVD, sputtering, evaporation, chemical solution deposition, metalorgano deposition, and atomic layer deposition.

The doping of the gate conductor 66 shifts the workfunction of the gate conductor formed. Illustrative examples of dopant ions for nFETs include elements from Group VA of the Periodic Table of Elements; Group IIIA elements can be used when pFETs are formed. The thickness, i.e., height, of the gate conductor 66 deposited at this point of the present invention may vary depending on the deposition process employed. Typically, the gate conductor 66 has a vertical thickness from about 20 to about 180 nm, with a thickness from about 40 to about 150 nm being more typical.

After providing the structure 60 shown in FIG. 3A, the TLR 50 shown in FIG. 2 is then formed atop the gate conductor 66 utilizing the deposition processes mentioned above.

Figure 3B:
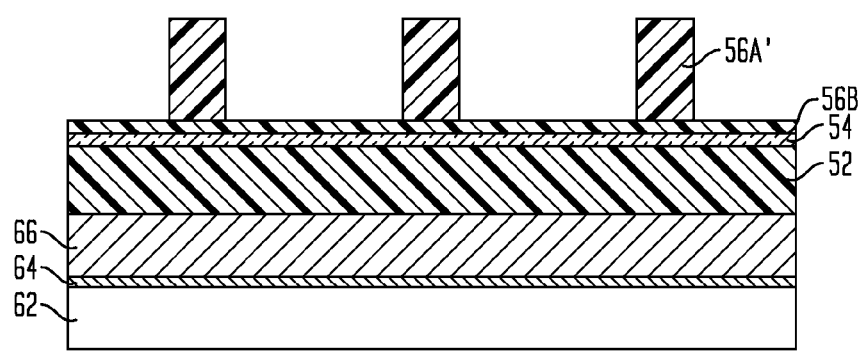

Next, the photoresist material 56A of the top organic layer 56 is patterned by lithography providing the structure shown, for example, in FIG. 3B. In this drawing, the patterned photoresist material of the top organic layer 56 is designated by reference numeral 56A'. In particular, the photoresist material 56 is first exposed to a pattern of radiation (i.e., a gate pattern) and then the exposed photoresist is developed using a conventional resist developer.

Figure 3C:
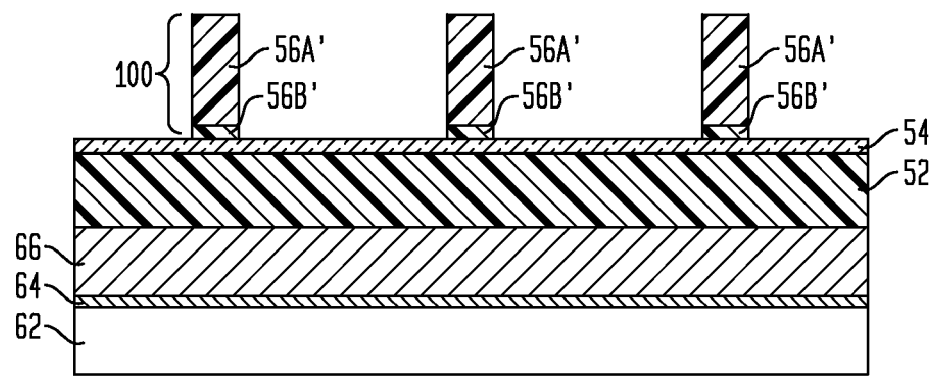

After patterning the photoresist material 56A forming patterned photoresist material 56A', the ARC 56B that is not protected by the patterned photoresist material 56A' is trimmed utilizing a trimming process such as, for example, an isotropic etch. By "trimming" it is meant that the gate CD post lithographic processing is reduced to the target value, which in the case of 65 nm technology would correspond to a 40 nm CD. As is illustrated in FIG. 3C, the trimming removes the exposed portions of the ARC 56B, to provide a trimmed ARC 56B' whose vertically sidewalls are offset in an inward direction from the vertical sidewalls of the patterned photoresist material 56A'.

It is noted that remaining top organic layer 56 comprised of the patterned photoresist material 56A' and the trimmed ARC 56B serves as a first pattern mask 100 for the subsequent etching of exposed portions of the middle inorganic layer 54.

Figure 3D:
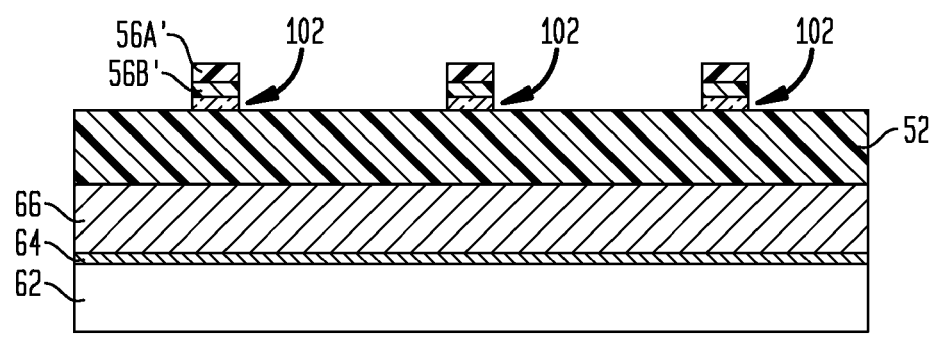

FIG. 3D illustrates the structure that is formed after etching the exposed portions of the middle inorganic layer 54 utilizing the first pattern mask 100 to transfer the gate pattern to the middle inorganic layer 54. The etching used in removing the exposed portions of the middle inorganic layer 54 comprises any dry etching process that selectively removes inorganic material as compared to the surrounding organic material; note that the etching stops on an upper surface of the bottom organic layer 52. Dry etching includes reactive ion etching, ion beam etching or plasma etching. When the middle inorganic layer 54 comprises an oxide, dry plasma etching using fluorine-containing chemistries ($CF_4$, $CHF_3CH_2F_2$, $CH_3F$, or any combinations thereof) can be used to remove the exposed portions of the middle inorganic layer 54 utilizing the first pattern mask 100 to transfer the gate pattern to that layer. It is noted that during this etching process, some of the patterned photoresist material 56A' is consumed (See FIG. 3C). The etched middle inorganic layer serves as a second pattern mask 102 during the subsequent etching of the now exposed portions of the bottom organic layer 52.

Figure 3E:
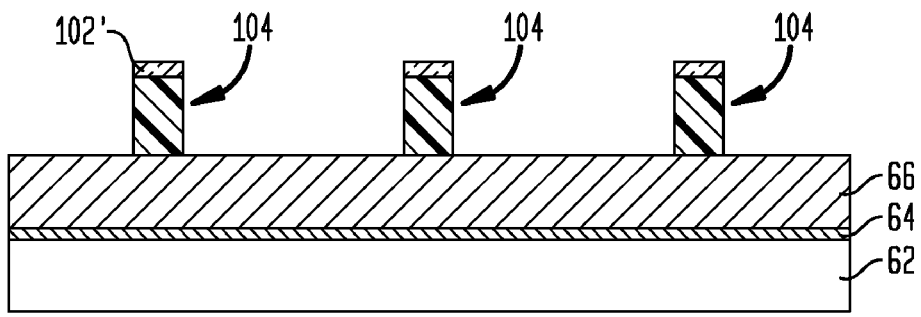

FIG. 3E shows the resultant structure that is formed after etching the exposed portions of the bottom organic layer 52 utilizing the second pattern mask 102 to transfer the gate pattern to the bottom organic layer 52. The etching used in providing the structure shown in FIG. 3E comprises any dry etching process that selectively removes organic material relative to inorganic material; note that this etching stops on an upper surface of the gate conductor 66. An example of an etching process that can be used to selectively remove the exposed portions of the bottom organic layer 52 comprises any oxidizing ($O_2$, $CO$, $CO_2$, $H_2O$ or combinations thereof) and/or reducing ($N_2$, $H_2$, $NH_3$ or combinations thereof) plasma chemistries.

It is noted that during this etching step, the trimmed ARC 56B' as well as any remaining patterned photoresist material 56A' is removed and, as such, the top organic layer 56 of the original TLR 50 is completely removed following the etching of the bottom organic layer 52. The etched bottom organic layer serves as a third pattern mask 104 during the subsequent etching of the exposed portions of the gate conductor 66.

Figure 3F:
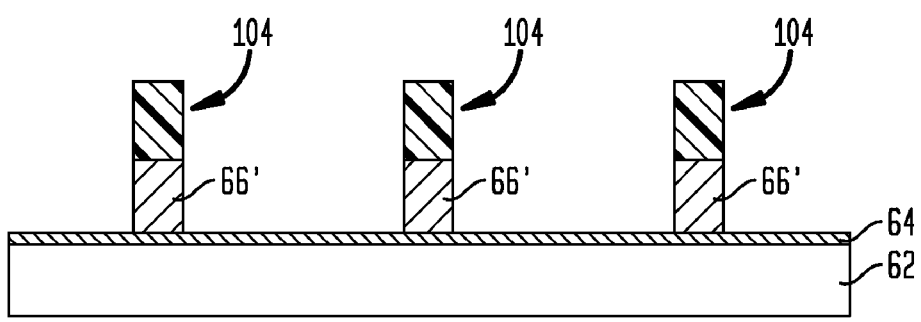

FIG. 3F shows the resultant structure that is formed after the gate pattern has been transferred to the gate conductor 66. In this drawing, the patterned gate conductor is designated by reference numeral 66'. Specifically, another etching process is used that selectively removes gate conductor material as compared with organic material; note that this etching process may stop on an upper surface of the gate dielectric 64, or it may stop atop the upper surface of the semiconductor substrate 62. FIG. 3F shows the embodiment in which this etching step stops atop the gate dielectric 64 (which is typical and desirable).

An example of an etching process that can be used to complete the gate pattern transfer is $CF_4$ and $CHF_3$ for breaking through the native oxide and $Cl_2$, HBr, He, and $O_2$ for etching the polysilicon gate. It is noted that during the etching of the polysilicon gate some of the bottom organic layer 52 of the TRL 50 is consumed and the remaining inorganic layer is consumed.

It is noted that the patterned gate conductors 66' formed at this point of the present invention have a CD of less than 40 nm, with a CD of less than 30 nm being more preferred. Also, the patterned gate conductors 66' have an aspect ratio (i.e., height to width) ratio from about 2:1 to about 5:1, with an aspect ratio of about 2.5 to about 4:1 being more highly preferred.

In addition to the above characteristics, the patterned gate conductors 66' formed utilizing the present invention have minimal LER and LWR values. In particular, the patterned gate conductors have a LER of less than 3.0 nm, and a LWR of less than 3.0 nm.

Figure 3G:
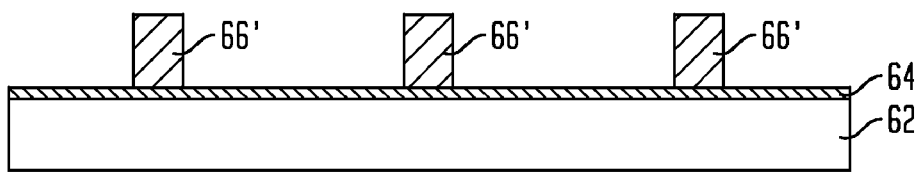

FIG. 3G shows the structure that is formed after stripping the remaining bottom organic layer 52 therefrom. Any conventional stripping process which selectively removes organic material can be used in the present invention.

At this point of the present invention, conventional CMOS processes can be performed including formation of source/drain extensions regions, source/drain regions, halo regions, spacers, silicide contacts, etc. After CMOS processing any conventional middle-of-the-line (MOL) and back-end-of-the-line (BEOL) processes can also be performed.

Figure 4A:
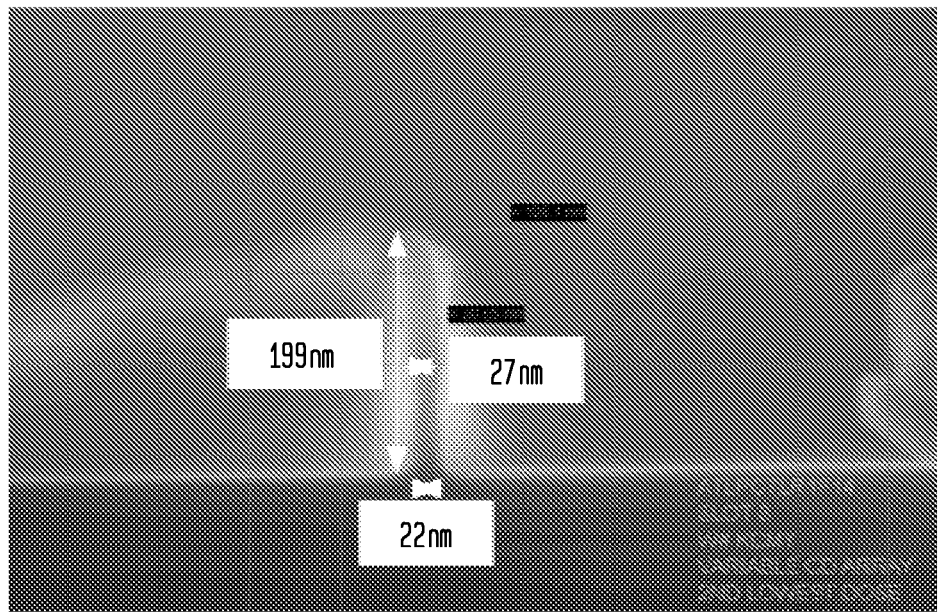
FIGS. 4A-4B are post gate etch XSEM images showing 22 nm gate CDs for an undoped polySi-containing structure.
Figure 4B:
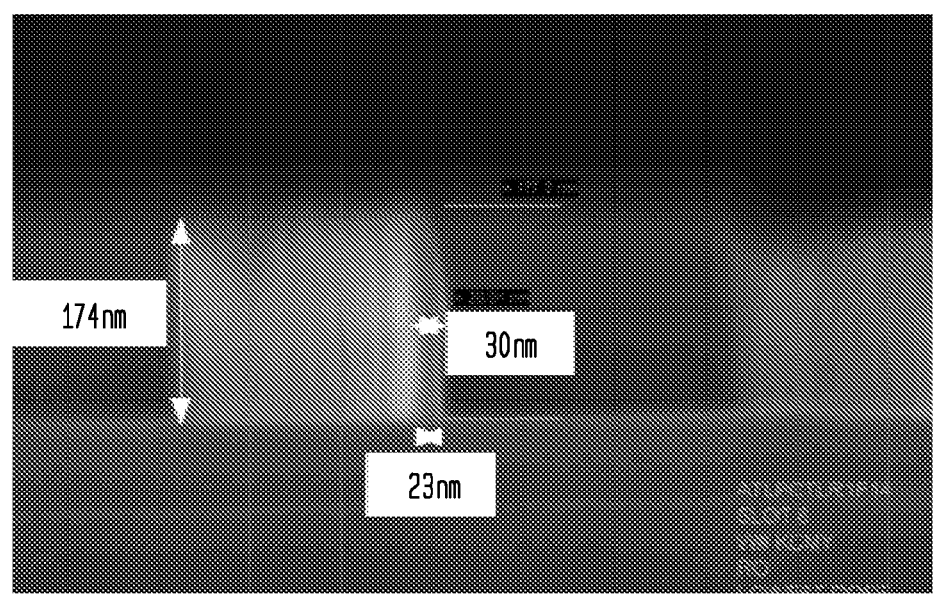

Reference is now made to FIGS. 4A and 4B which are actual post gate etch XSEM images showing 22 nm gate CDs for an undoped polySi-containing structure. The undoped polySi-containing structure was prepared utilizing the TLR patterning scheme mentioned above. FIG. 4A is for a variable CD array and FIG. 4B is for a ring oscillator.

Figure 5A:
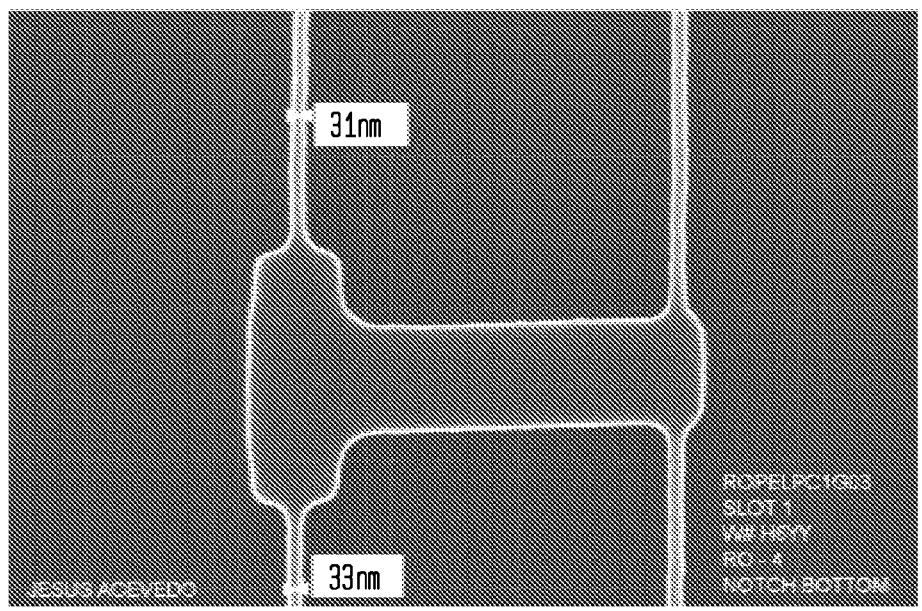
FIGS. 5A-5B are post gate etch, strip, and DHF TD-SEM images showing 32 nm and 25 nm gate CDs for a pre-doped polySi-containing structure. These figures reveal that minimum attainable CDs can be tuned by adjusting the bottom organic layer thickness.
Figure 5B:
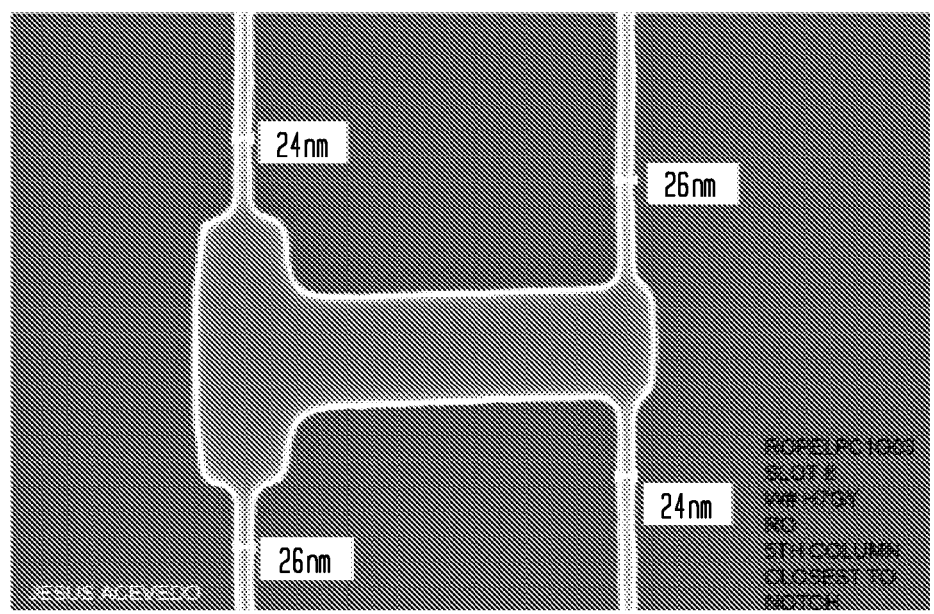

FIGS. 5A-5B are actual post gate etch, strip, and DHF TD-SEM images showing 32 nm and 25 nm gate CDs for a pre-doped polySi-containing structure. These figures reveal that minimum attainable CDs can be tuned by adjusting the bottom organic layer thickness. FIG. 5A denotes the minimum CD attainable (32 nm) using 100 nm of the bottom organic layer, while FIG. 5B shows the minimum CD attainable (25 nm) using 75 nm thickness of this said layer. The reduced gate CD limit for the thinner bottom organic layer (75 nm) is indicative of the sensitivity and dependence of the plasma etch process window on the thickness of this bottom organic layer.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of patterning a gate conductor comprising:
    providing a trilayer resist (TLR) on a surface of a gate conductor, said TLR comprises a top organic layer, a middle inorganic layer and a bottom organic layer;
    patterning said top organic layer by lithography and trimming;
    first etching said middle inorganic layer utilizing said patterned top organic layer as a first pattern mask, wherein during said etching a portion of said top organic layer is consumed;
    second etching said bottom organic layer utilizing said patterned middle inorganic layer as a second pattern mask, wherein during said second etching said top organic layer is completely consumed;
    third etching said gate conductor utilizing said etched bottom organic layer as a third pattern mask, wherein during said third etching said middle inorganic layer is removed; and
    stripping the etched bottom organic layer to provide at least one patterned gate conductor having a critical dimension of less than 40 nm.

2. The method of claim 1 wherein said top organic layer of said TLR comprises an organic photoresist material located on top of an organic antireflective coating (ARC).

3. The method of claim 1 wherein said middle inorganic layer comprises an oxide, a Si-containing ARC or multilayers thereof.

4. The method of claim 1 wherein said bottom organic material comprises New Frictionless Carbon, diamond-like carbon, a thermosetting polyarylene ether or multilayers thereof.

5. The method of claim 1 wherein said bottom organic material has a thickness from about 200 to about 2000 Å.

6. The method of claim 1 wherein said gate conductor is doped.

7. The method of claim 1 wherein said gate conductor comprises polysilicon.

8. A method of patterning a polysilicon gate conductor comprising:
    providing a trilayer resist (TLR) on a surface of a polysilicon gate conductor, said TLR comprises a top photoresist/antireflective coating layer, a middle oxide layer and a bottom organic layer;
    patterning said top photoresist/antireflective coating layer by lithography and trimming;
    first etching said middle oxide layer utilizing said patterned top photoresist/antireflective coating layer as a first pattern mask, wherein during said etching a portion of said top photoresist/antireflective coating layer is consumed;
    second etching said bottom organic layer utilizing said patterned middle oxide layer as a second pattern mask, wherein during said second etching said top photoresist/antireflective coating layer is completely consumed;
    third etching said polysilicon gate conductor utilizing said etched bottom organic layer as a third pattern mask, wherein during said third etching said middle oxide layer is removed; and
    stripping the etched bottom organic layer to provide at least one patterned polysilicon gate conductor having a critical dimension of less than 40 nm.

9. The method of claim 8 wherein said polysilicon gate conductor is undoped.

10. The method of claim 8 wherein said polysilicon gate conductor is doped.

11. The method of claim 8 wherein said bottom organic layer comprises Near Frictionless Carbon, diamond-like carbon, a thermosetting polyarylene ether or multilayers thereof.

12. The method of claim 8 wherein said bottom organic layer said has a thickness from about 200 to about 2000 Å.

13. The method of claim 8 wherein said polysilicon gate conductor is an element of a pFET.

14. The method of claim 8 wherein said polysilicon gate conductor is an element of an nFET.

* * * * *